US010506729B2

(12) United States Patent
Hendrix et al.

(10) Patent No.: US 10,506,729 B2
(45) Date of Patent: Dec. 10, 2019

(54) ELECTRONICS ENCLOSURE WITH LOW-PROFILE DOOR

(71) Applicant: CommScope Technologies LLC, Hickory, NC (US)

(72) Inventors: Walter Mark Hendrix, Richardson, TX (US); Danny Turner, McKinney, TX (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/149,773

(22) Filed: Oct. 2, 2018

(65) Prior Publication Data

US 2019/0150306 A1 May 16, 2019

Related U.S. Application Data

(60) Provisional application No. 62/584,316, filed on Nov. 10, 2017.

(51) Int. Cl.
*H05K 5/02* (2006.01)
*E06B 3/48* (2006.01)
*E06B 3/70* (2006.01)

(52) U.S. Cl.
CPC .......... *H05K 5/0217* (2013.01); *E06B 3/481* (2013.01); *E06B 3/7003* (2013.01); *H05K 5/0221* (2013.01); *H05K 5/0226* (2013.01); *E06B 2003/7049* (2013.01)

(58) Field of Classification Search
CPC .. H05K 5/0217; H05K 5/0221; H05K 5/0239; H05K 5/0226; E06B 3/481; E06B 2003/7049

USPC .......... 49/163, 164, 166, 168, 169, 170, 171
See application file for complete search history.

(56) References Cited

U.S. PATENT DOCUMENTS

| | | | | |
|---|---|---|---|---|
| 4,317,415 A * | 3/1982 | Galasan | .................... | B60P 3/08 |
| | | | | 105/378 |
| 6,745,515 B1 * | 6/2004 | Chen | ....................... | E05B 65/10 |
| | | | | 160/180 |
| 7,562,743 B2 * | 7/2009 | Beeson | ..................... | E06B 5/20 |
| | | | | 160/216 |
| 8,806,807 B2 * | 8/2014 | Rees | ....................... | E05D 15/48 |
| | | | | 49/130 |
| 2010/0012280 A1 * | 1/2010 | Hans | ....................... | E05D 15/26 |
| | | | | 160/211 |

(Continued)

*Primary Examiner* — Daniel J Rohrhoff
(74) *Attorney, Agent, or Firm* — Myers Bigel, P.A.

(57) ABSTRACT

An electronics cabinet includes an enclosure comprising a floor, a ceiling, a rear wall, and opposed side walls configured to form an internal cavity a door assembly attached to one of the side walls. The door assembly includes: a main door pivotally connected to the enclosure, the main door including a window, the main door being movable between a closed position and an ajar position; and a plurality of door panels, the door panels pivotally connected with each other, at least some of the door panels being pivotally and slidably attached to the main door, the door panels configured to move from an unfolded position, in which the door panels are generally coplanar and block access to the window, and a folded position, in which the door panels are generally parallel and non-coplanar. The main door and door panels are configured so that the door panels cannot move from the unfolded position to the folded position unless the main door is in the ajar position.

20 Claims, 15 Drawing Sheets

(56) References Cited

U.S. PATENT DOCUMENTS

| | | | | |
|---|---|---|---|---|
| 2012/0062084 A1* | 3/2012 | Lewis, II | ............ | H05K 5/0234 |
| | | | | 312/223.6 |
| 2013/0186038 A1* | 7/2013 | Lang | ....................... | E05D 15/26 |
| | | | | 52/745.16 |
| 2013/0212947 A1* | 8/2013 | Goldenberg | .......... | E06B 3/5054 |
| | | | | 49/168 |
| 2014/0352220 A1* | 12/2014 | Rees | ........................ | H04N 1/00 |
| | | | | 49/164 |
| 2016/0215526 A1* | 7/2016 | AbuGhazaleh | ....... | E05B 65/006 |
| 2017/0020025 A1* | 1/2017 | Huang | ................... | H05K 7/186 |

* cited by examiner

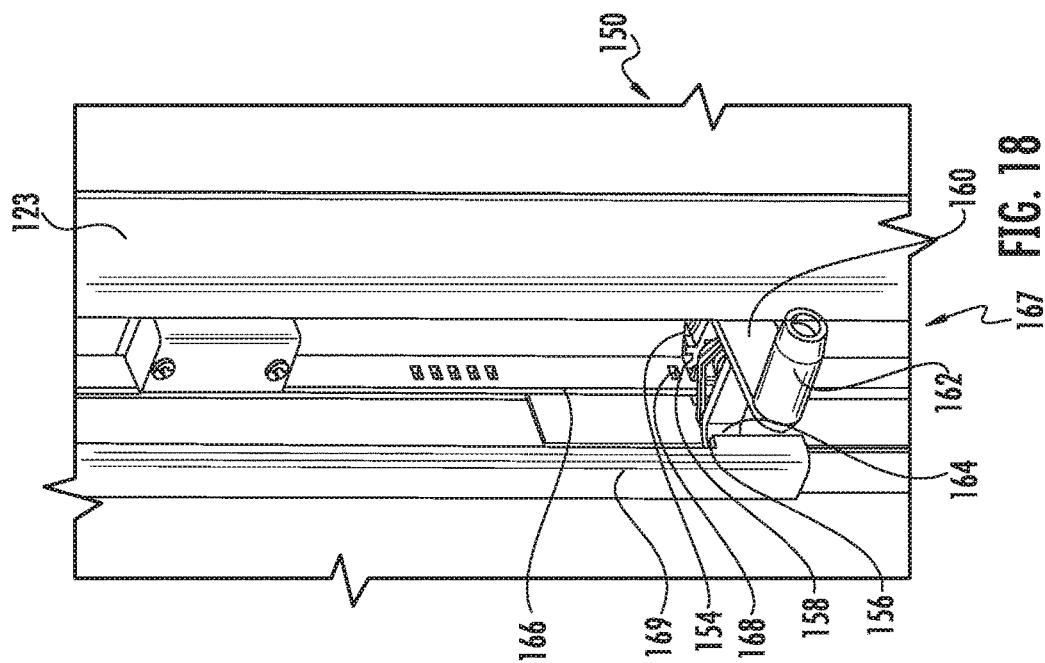
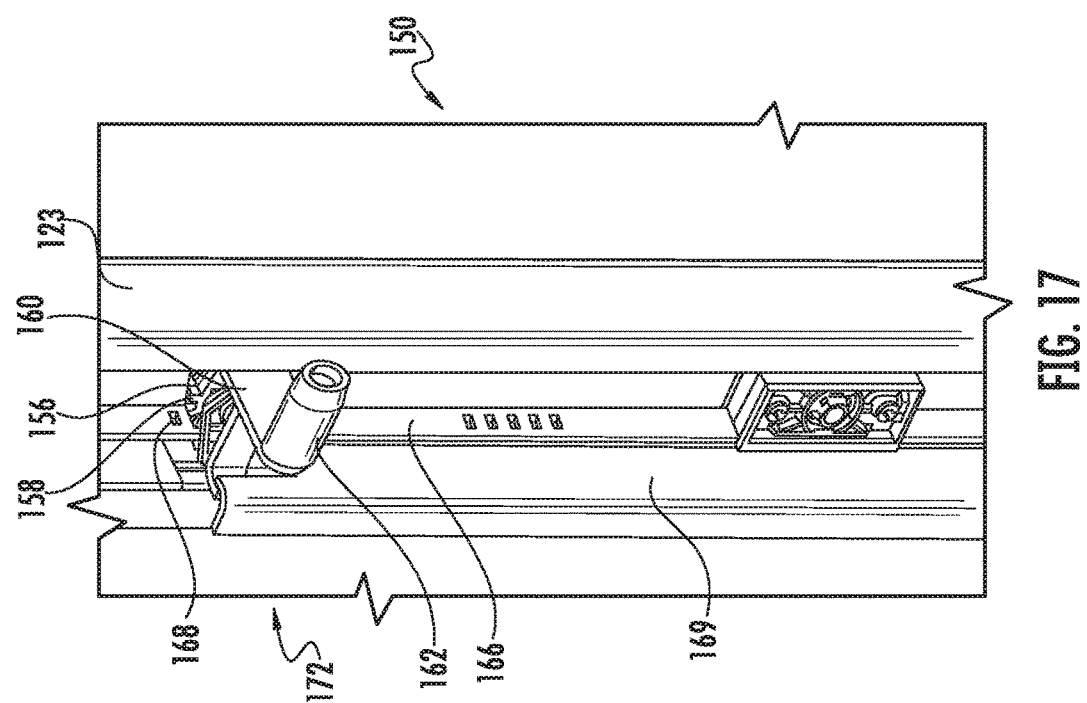

FIG. 23
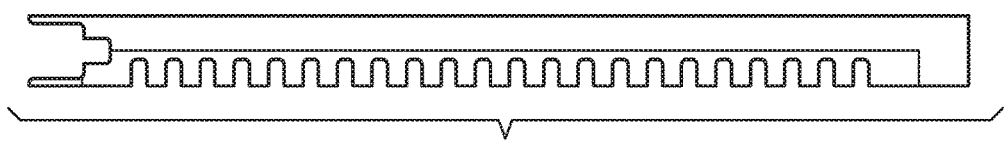
FIG. 24
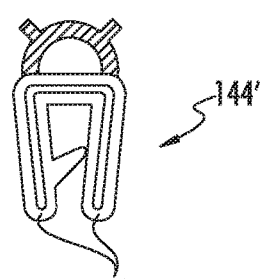
FIG. 25

ELECTRONICS ENCLOSURE WITH LOW-PROFILE DOOR

The present application claims priority from and the benefit of U.S. Provisional Patent Application No. 62/584,316, filed Nov. 10, 2017, the disclosure of which is hereby incorporated herein in its entirety.

FIELD OF THE INVENTION

The present invention relates generally to cabinets, and more specifically to electronics cabinets.

BACKGROUND

Outdoor electronic cabinets have become popular in recent years. They can protect a wide range of electronic equipment including radios, multicarrier power amplifiers (MCPA), power suppliers, batteries, and wireless cell site backhaul equipment. These cabinets can protect base station equipment from environmental conditions while minimizing operating expenses and energy consumption.

Typically, electronics cabinets include one or two doors mounted to the front of the cabinet to provide access to components positioned within the front portion of the cabinet. Such cabinets also typically include one or more removable panels that form much of the rear wall of the cabinet to permit access to the rear of the cabinet.

As wireless networks evolve, the trend in most regions is for increasing leasing costs and more restrictive zoning regulation for deployment of wireless cell sites and associated equipment enclosures. Leasing costs and zoning approvals can be heavily influenced by the footprint size of the cell site to be deployed. For equipment enclosures, site footprint includes both the enclosure base itself, the extended dimensions for any door arc swings, and craft walking space beyond the enclosure footprint and door swing extensions.

As noted above, typical telecommunications enclosures have full or half-width doors. Such doors have large door swing clearances that extend the site footprint of the enclosure, which in turn can increase the leasing cost of the site.

SUMMARY

As a first aspect, embodiments of the invention are directed to an electronics cabinet, comprising: an enclosure comprising a floor, a ceiling, a rear wall, and opposed side walls configured to form an internal cavity; and a door assembly attached to one of the side walls. The door assembly comprises: a main door pivotally connected to the enclosure, the main door including a window, the main door being movable between a closed position and an ajar position, wherein in the ajar position the main door is pivoted between about 3 and 15 degrees from the closed position; and a plurality of door panels, the door panels pivotally connected with each other, at least some of the door panels being pivotally and slidably attached to the main door, the door panels configured to move from an unfolded position, in which the door panels are generally coplanar and block access to the window, and a folded position, in which the door panels are generally parallel and non-coplanar and permit access to the window.

As a second aspect, embodiments of the invention are directed to an electronics cabinet, comprising: an enclosure comprising a floor, a ceiling, a rear wall, and opposed side walls configured to form an internal cavity; and a door assembly attached to one of the side walls. The door assembly comprises: a main door pivotally connected to the enclosure, the main door including a window, the main door being movable between a closed position and an ajar position; and a plurality of door panels, the door panels pivotally connected with each other, at least some of the door panels being pivotally and slidably attached to the main door, the door panels configured to move from an unfolded position, in which the door panels are generally coplanar and block access to the window, and a folded position, in which the door panels are generally parallel and non-coplanar. The main door and door panels are configured so that the door panels cannot move from the unfolded position to the folded position unless the main door is in the ajar position.

As a third aspect, embodiments of the invention are directed to a method of opening an electronics cabinet, comprising the steps of:
(i) providing an electronics cabinet comprising:
   a. an enclosure comprising a floor, a ceiling, a rear wall, and opposed side walls configured to form an internal cavity; and
   b. a door assembly attached to one of the side walls, the door assembly comprising:
      a main door pivotally connected to the enclosure, the main door including a window; and
      a plurality of door panels, the door panels pivotally connected with each other, at least some of the door panels being pivotally and slidably attached to the main door;
(ii) pivoting the main door from a closed position, in which the door assembly prevents access to the internal cavity, to an ajar position; and
(iii) moving the door panels from an unfolded position, in which the door panels are generally coplanar and block access to the window, and a folded position, in which the door panels are generally parallel and non-coplanar and provide access to the internal cavity through the window.

BRIEF DESCRIPTION OF THE FIGURES

FIG. 17 is an enlarged partial rear view of the door and locking assembly of the cabinet of FIG. 1, with the locking assembly in its locked configuration.

FIG. 18 is another enlarged partial rear view of the door and locking assembly of the cabinet of FIG. 1, with a different locking assembly in its locked configuration.

FIG. 23 shows top views of various door panel profiles for door panels of cabinets according to embodiments of the invention.

FIG. 24 shows top views of various door panel profiles for door panels of cabinets according to additional embodiments of the invention.

FIG. 25 is a section view of an alternative gasket to be positioned between folding door panels of the cabinet of FIG. 1.

DETAILED DESCRIPTION

Figure 1:
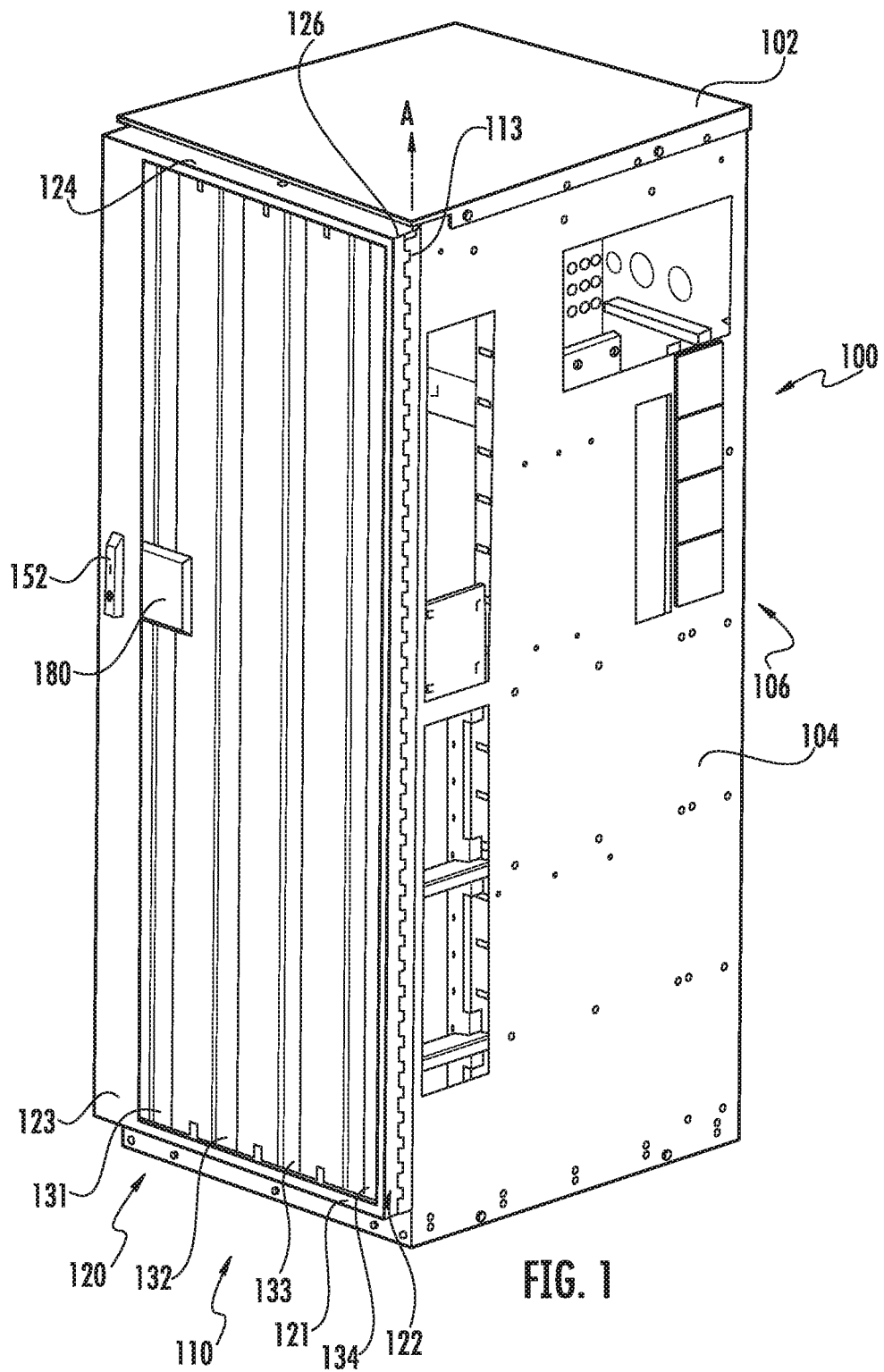
FIG. 1 is a perspective view of an electronics cabinet according to embodiments of the invention with the door in its closed position.

The present invention is described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Like numbers refer to like elements throughout. In the figures, the thickness of certain lines, layers, components, elements or features may be exaggerated for clarity.

The terminology used herein is for the purpose of describing particular embodiments only and is not intended to be limiting of the invention. Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the specification and relevant art and should not be interpreted in an idealized or overly formal sense unless expressly so defined herein. Well-known functions or constructions may not be described in detail for brevity and/or clarity.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, phrases such as "between X and Y" and "between about X and Y" should be interpreted to include X and Y. As used herein, phrases such as "between about X and Y" mean "between about X and about Y." As used herein, phrases such as "from about X to Y" mean "from about X to about Y."

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" another feature may have portions that overlap or underlie the adjacent feature.

Spatially relative terms, such as "under", "below", "lower", "over", "upper", "lateral", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. The device may be otherwise oriented (rotated 90 degrees or at other orientations) and the descriptors of relative spatial relationships used herein interpreted accordingly.

It will also be understood that, as used herein, the terms "example," "exemplary," and derivatives thereof are intended to refer to non-limiting examples and/or variants embodiments discussed herein, and are not intended to indicate preference for one or more embodiments discussed herein compared to one or more other embodiments.

The invention being thus described, it will be apparent that the same may be varied in many ways. Such variations are not to be regarded as a departure from the spirit and scope of the invention, and all such modifications as would be obvious to one skilled in the art are to be included within the scope of the following claims.

Referring now to the figures, an electronics enclosure according to embodiments of the invention is illustrated in FIGS. 1-22 and designated broadly at 100. The cabinet 100 is generally box-shaped, with a ceiling 102, side walls 104, a floor 107 (see FIG. 5), a rear wall 106, and a door assembly 110 that is pivotally attached to one of the side walls 104. These structures define an internal cavity 105, in which is typically stored electronic equipment such as radios, multi-carrier power amplifiers (MCPA), power suppliers, batteries, and wireless cell site backhaul equipment. To provide a sense of scale, the cabinet 100 may be between about 72 and 90 inches in height, between about 30 and 36 inches in width, and between about 30 and 48 inches in depth. The cabinet 100 is typically formed of a metallic material, such as steel.

Figure 4:
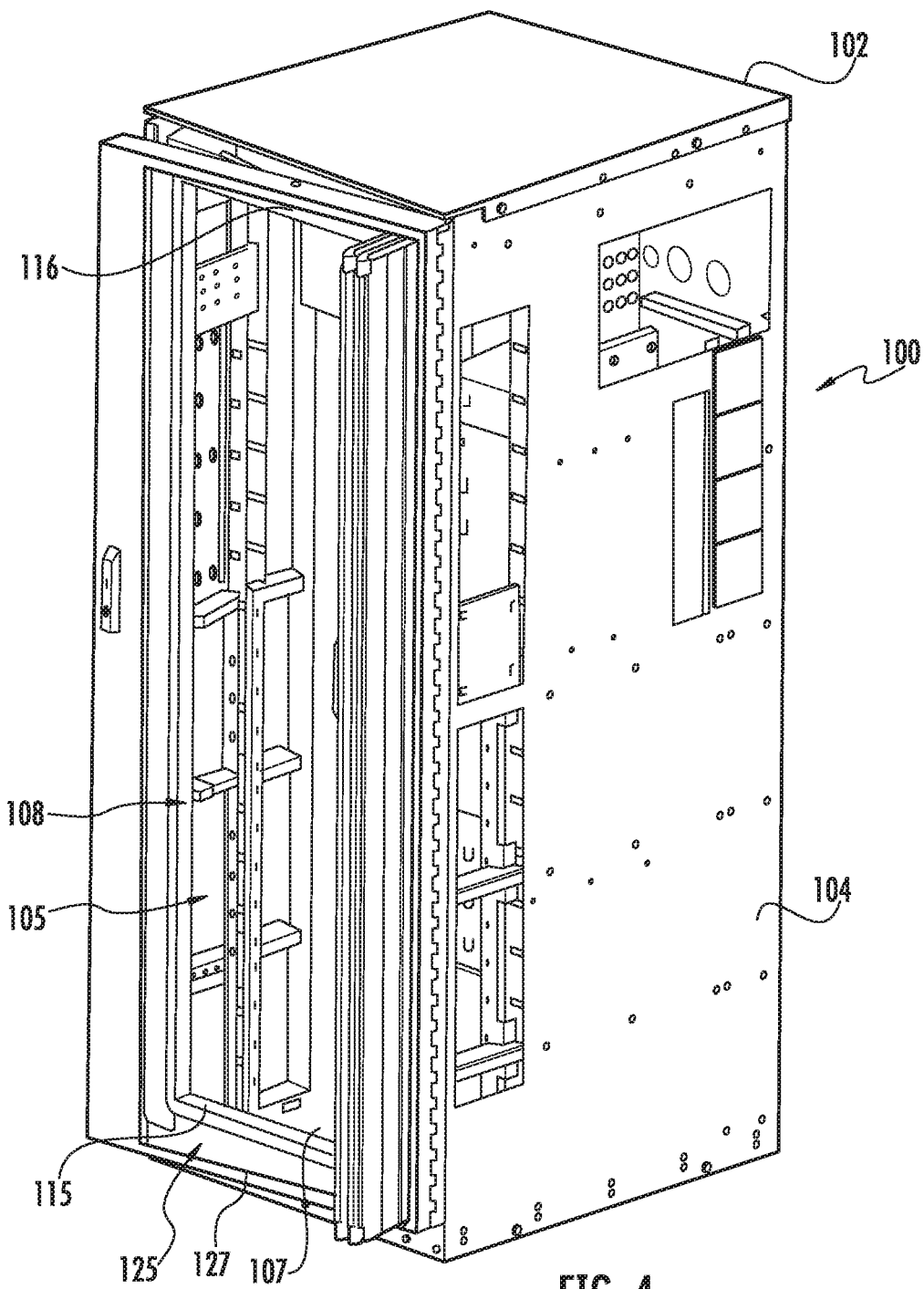
FIG. 4 is a perspective view of the electronics cabinet of FIG. 1 with the door assembly in its open position and the door panels in their folded position.
Figure 5:
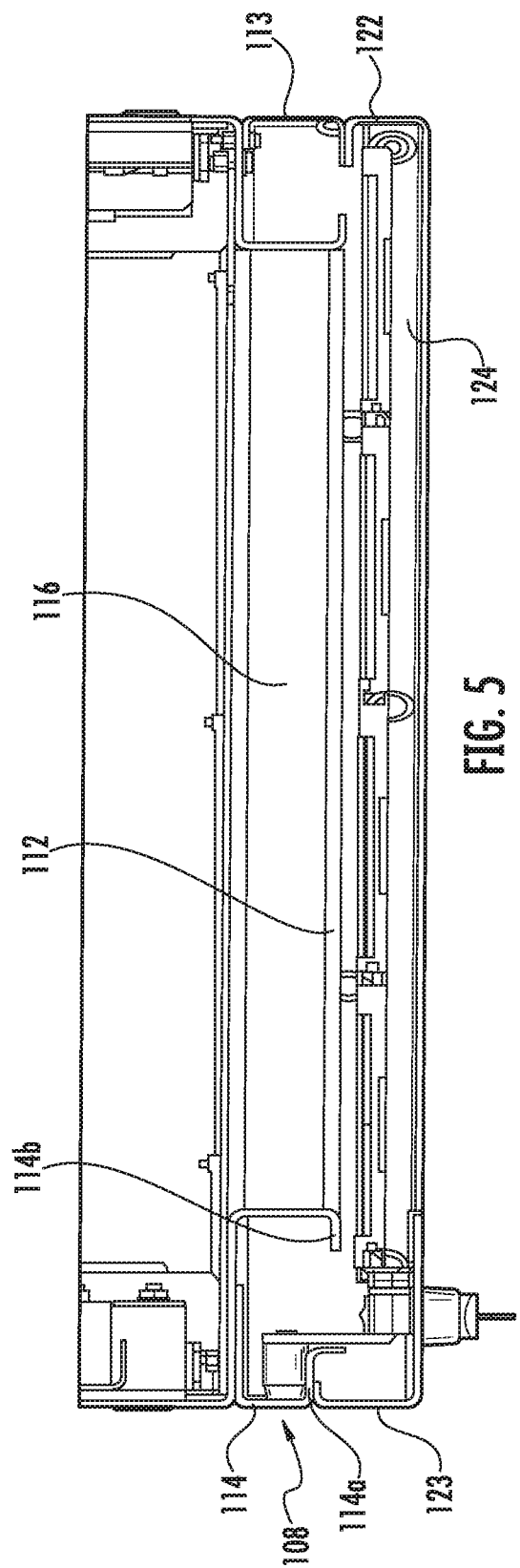
FIG. 5 is a top section view of the door assembly and cabinet frame of FIG. 1 showing the door assembly in a closed position and the lock in a locked condition.
Figure 6:
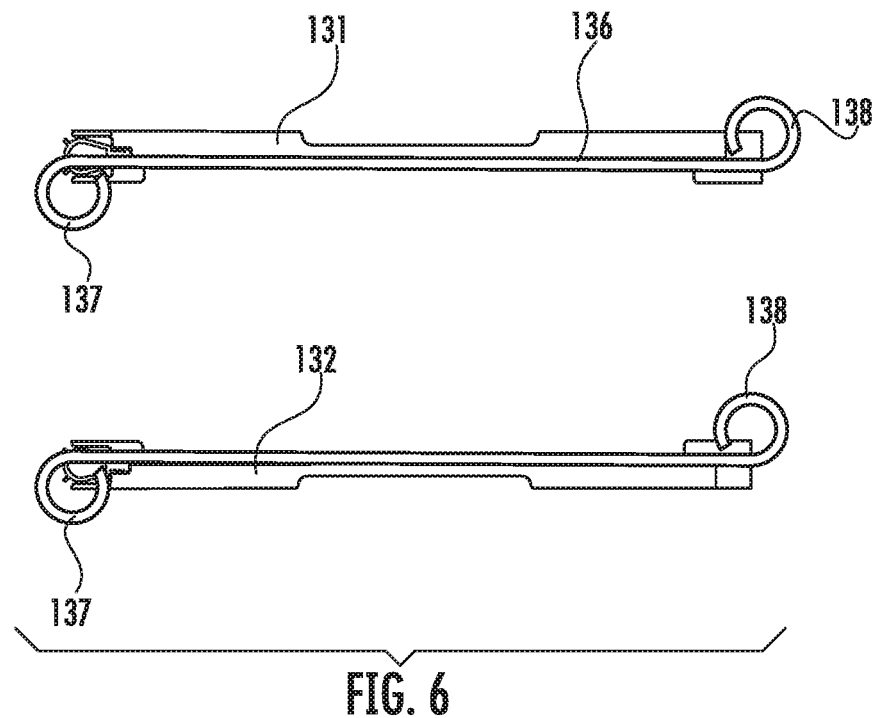
FIG. 6 is a top view of two adjacent door panels of the door assembly of the cabinet of FIG. 1 showing the hinge rings thereof.

As can be seen in FIGS. 4 and 5, a frame 108 is fixed to and lines the front edges of the side walls 104, the ceiling 102 and the floor 107. The frame 108 includes uprights 113, 114, a lower cross-member 115, and an upper cross-member 116. The upright 113 is generally C-shaped in profile and hollow. The upright 114 is also generally C-shaped and hollow, but the lateral flange 114a of the "C" is positioned slightly rearwardly of the inboard flange 114b. A gasket 112 is mounted on the forward surface of the frame 108 to provide environmental sealing for the cabinet 100 when the door assembly 110 is closed. A slotted bar 109 with a slot 109a is fixed to the upper cross-member 116 (see FIGS. 11 and 12).

Figure 11:
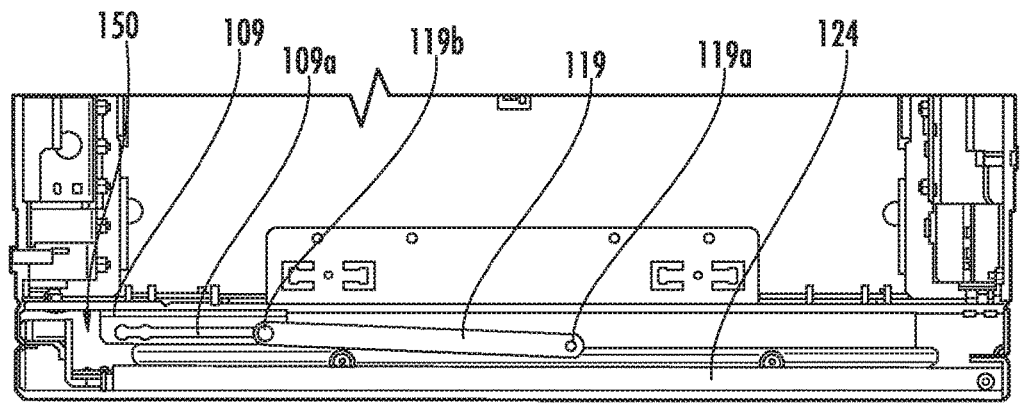
FIG. 11 is an enlarged partial top section view of the cabinet of FIG. 1 showing the door assembly in the closed position and the lock in the locked position.

The door assembly 110 includes a frame 120 with a lower cross-bar 121, uprights 122, 123 and an upper cross-bar 124 that define a window 125 (FIGS. 1, 5, 11 and 12). The upright 122 is attached to the upright 113 at a pivot 126 to allow the frame 120 (and, in turn, the door assembly 110) to pivot relative to the frame 108 (and, in turn, the cabinet 100) about a vertical axis A. As shown in FIG. 11, a stay bar 119 is pivotally attached to the upper cross-bar 124 at a pivot 119a and to the slotted bar 109 via a pin 119b inserted into the slot 109a.

Figure 2:
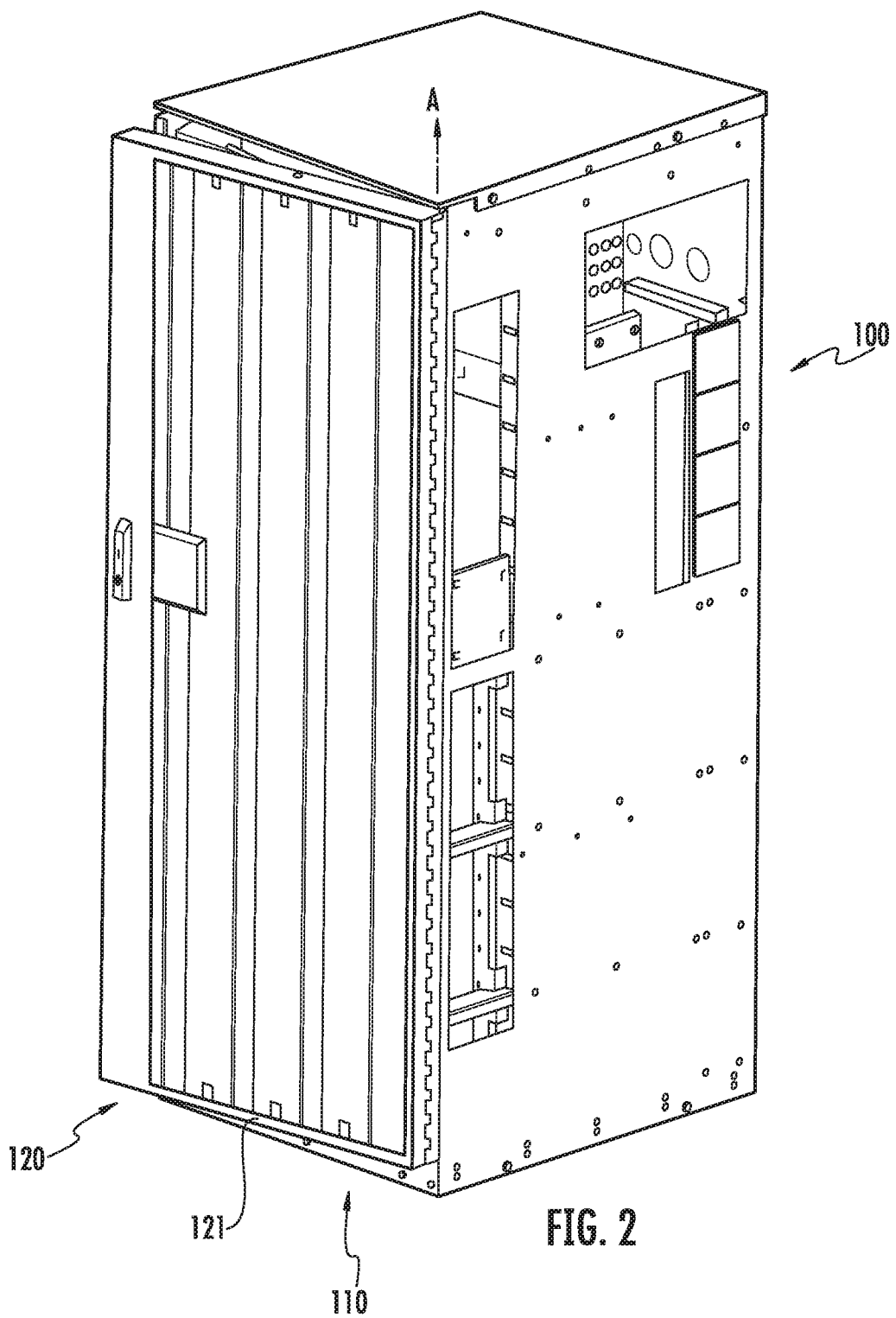
FIG. 2 is a perspective view of the electronics cabinet of FIG. 1 with the door assembly in its open position and the door panels in their unreleased position.
Figure 3:
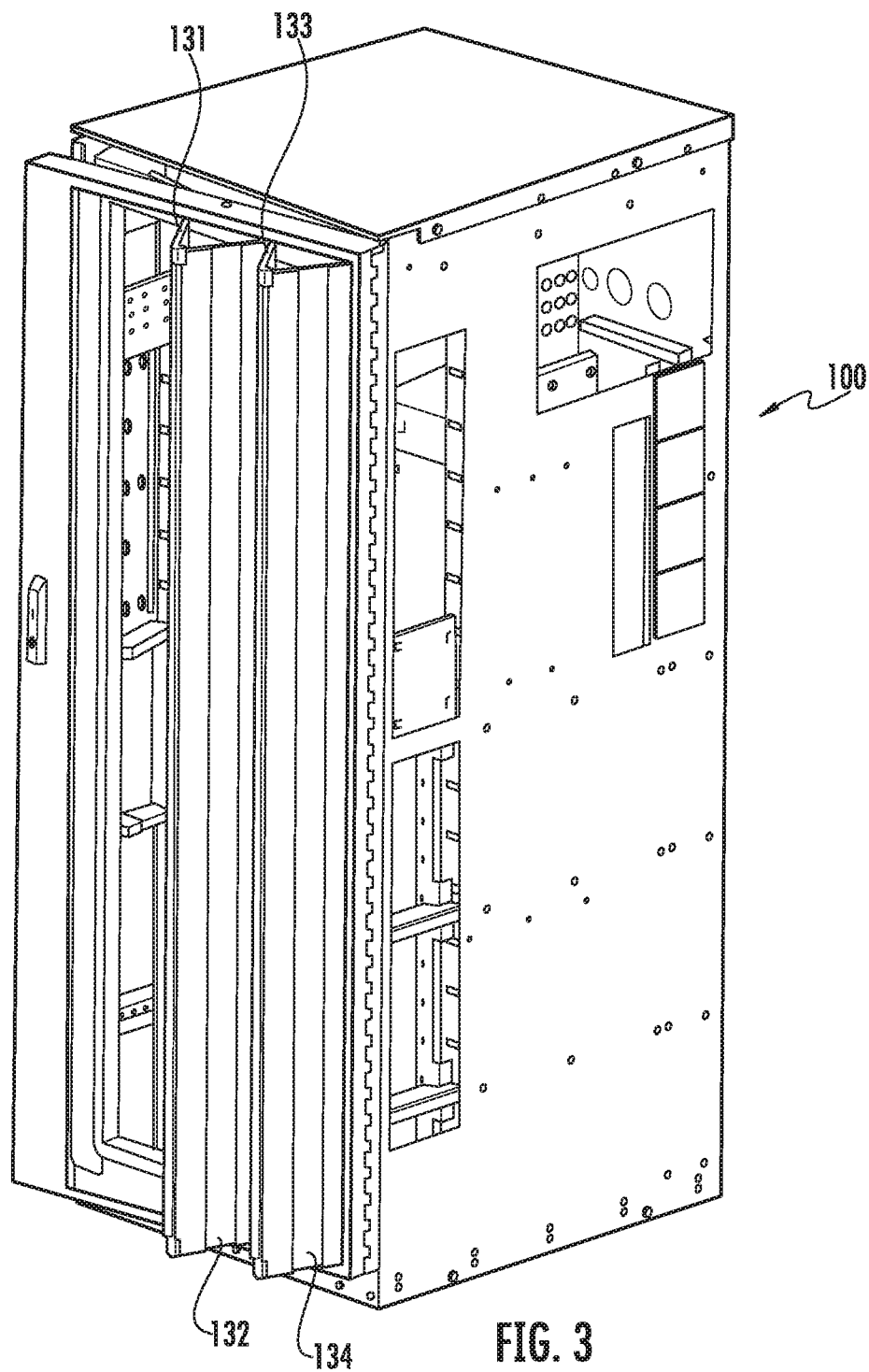
FIG. 3 is a perspective view of the electronics cabinet of FIG. 1 with the door assembly in its open position and the door panels in a partially folded position.
Figure 8:
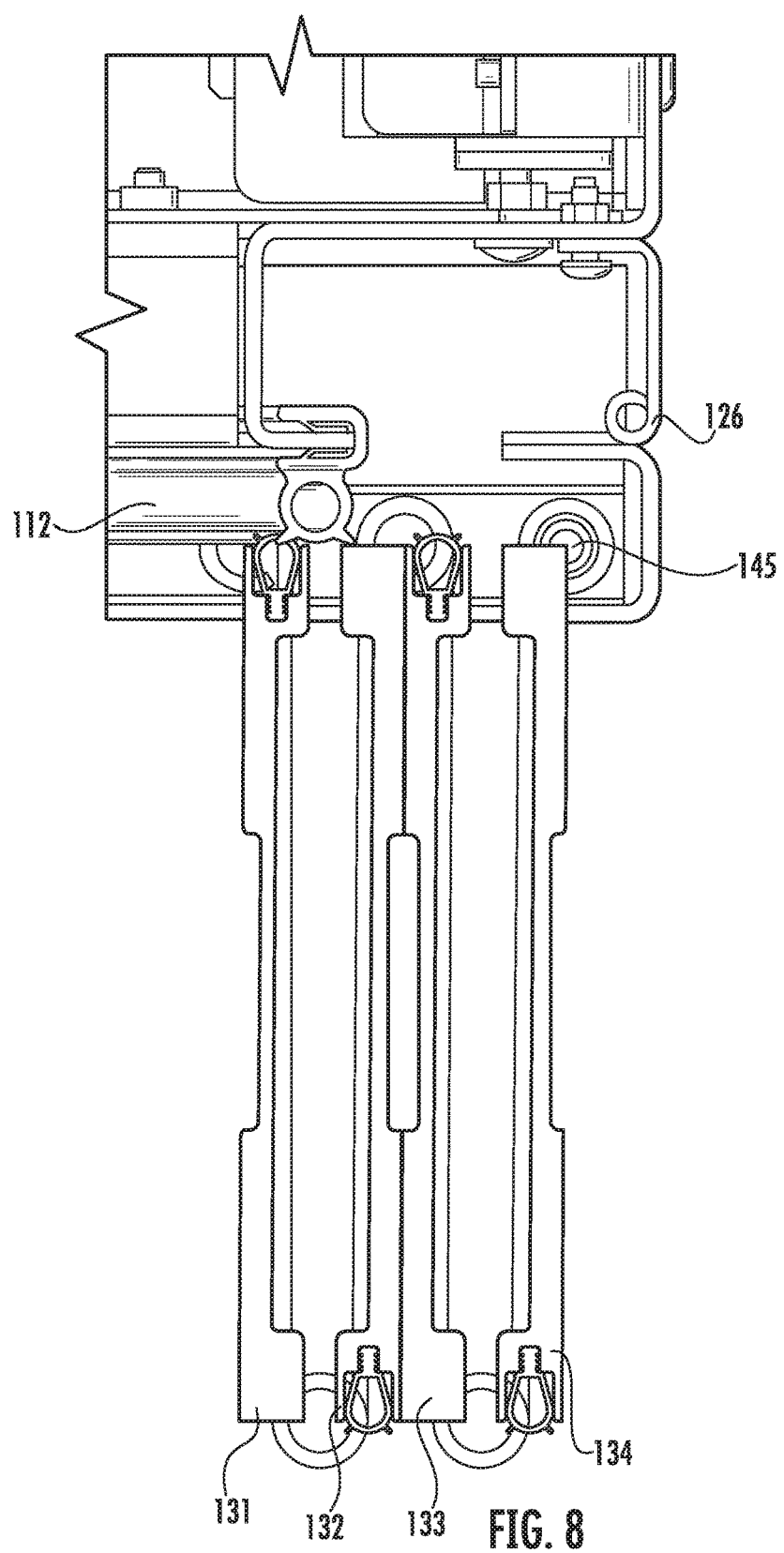
FIG. 8 is an enlarged top view of the door panels of the cabinet of FIG. 1 in the folded position.
Figure 9:
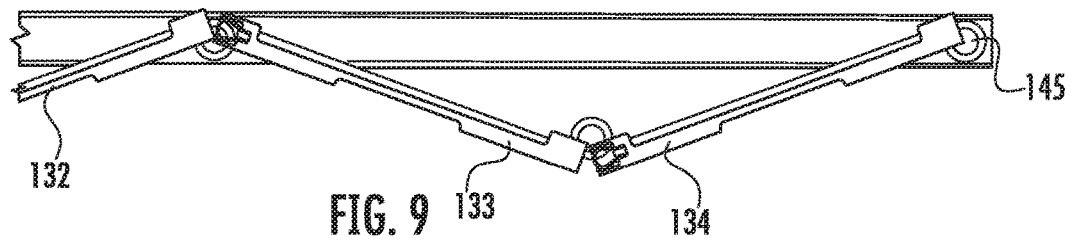
FIG. 9 is an enlarged top view of two door panels of the cabinet of FIG. 1 in a partially folded condition showing how the gaskets of the door panels provide a seal.
Figure 10:
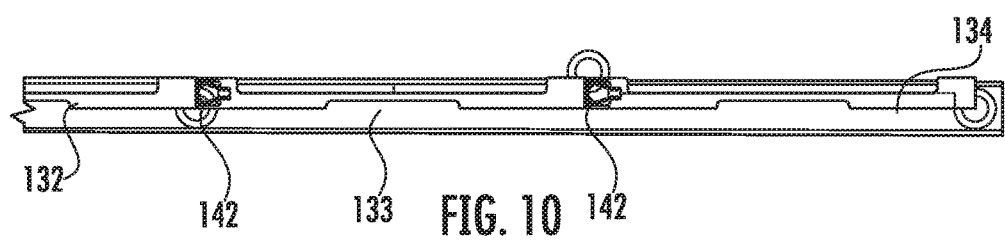
FIG. 10 is an enlarged top view of the two door panels of FIG. 9 in the closed condition showing how the gaskets of the door panels provide a seal.

The door assembly 110 also includes four folding door panels 131-134 (see FIGS. 1, 3 and 8). The door panels 131-134 are pivotally attached to each other at their edges to enable the door panels 131-134 to fold relative to each other (see FIGS. 2-4 and 8-10). These are described in greater detail below.

Figure 15:
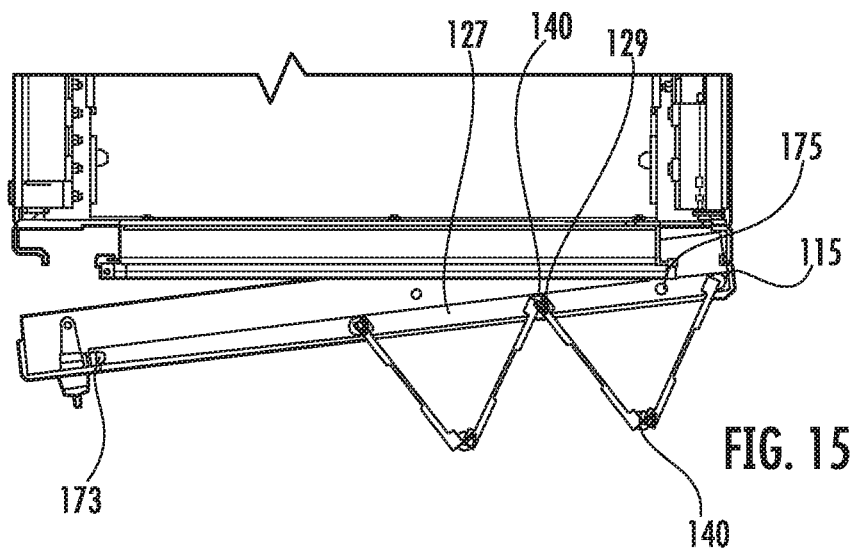
FIG. 15 is an enlarged partial top section view of the cabinet of FIG. 1 showing the door assembly in the open position and door panels in a partially folded condition.

Each of the door panels 131-134 includes two hinge bars 136 mounted to its top and bottom edges. Each hinge bar 136 includes a forward facing ring 137 and a rear facing ring 138 (see FIG. 6). The rings 137, 138 on adjacent door panels 131-134 overlap to form a hinge held together with pins 140 (one is shown in FIG. 15). The pins 140 that hold together the door panels 132, 133 include wheels that fit within tracks 127 in the upper cross-bar 124 and the lower cross-bar 121. The door panel 134 is pivotally attached to the upper and lower cross-bars 124, 121 at a pivot 145 (see FIG. 8).

Figure 7:
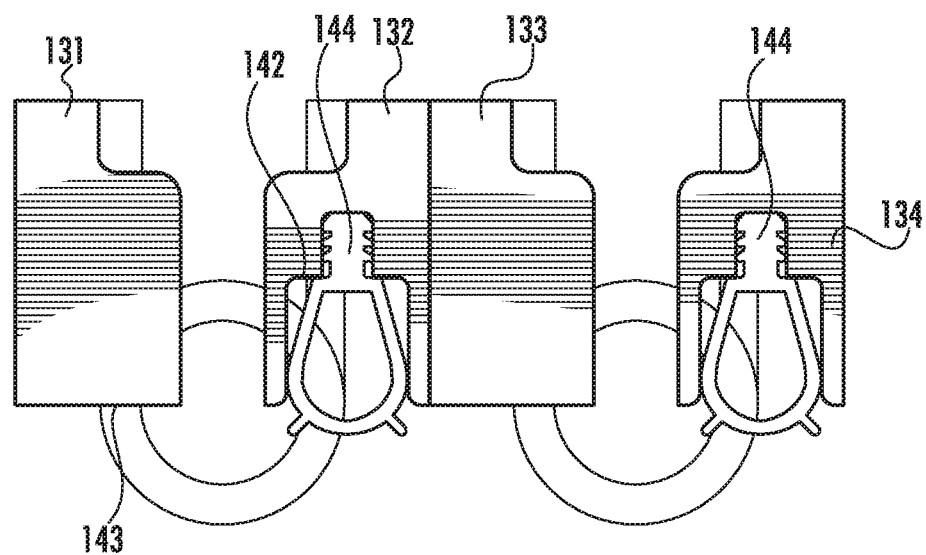
FIG. 7 is a greatly enlarged top view of two hinges of the door panels of the cabinet of FIG. 1 in the folded position.

Also, each door panel 131-134 includes a recess 142 in one side edge and a flat contact surface 143 on the opposite side edge (see FIG. 7). A gasket 144 resides in each of the recesses 142 that permits each door panel 132-134 to seal against its immediately adjacent door panel 131-133, and permits the door panel 131 to seal against the upright 123 of the frame 120 of the door assembly 110.

Referring now to FIGS. 16-22, the door assembly 110 also includes a lock assembly 150 mounted to the front surface of the upright 123. The lock assembly 150 includes an exterior handle 152 (see FIG. 1) configured to receive a conventional padlock (not shown) that prevents rotation of the handle 152. A shaft 154 extends through the upright 123. A cam 156 is fixed to the shaft 154. The cam 156 includes teeth 158 on its perimeter. A dual lock member 160 is fixed relative to the cam 156 to rotate therewith. The dual lock member 160 includes a main door catch 162 and a folding panel catch 164 on opposite ends thereof. These components comprise a subassembly 167 (FIG. 18).

A common lock bar 166 extends vertically parallel to the upright 123. The common lock bar 166 includes holes 168 configured to receive the teeth 158 of the cam.

Figure 16:
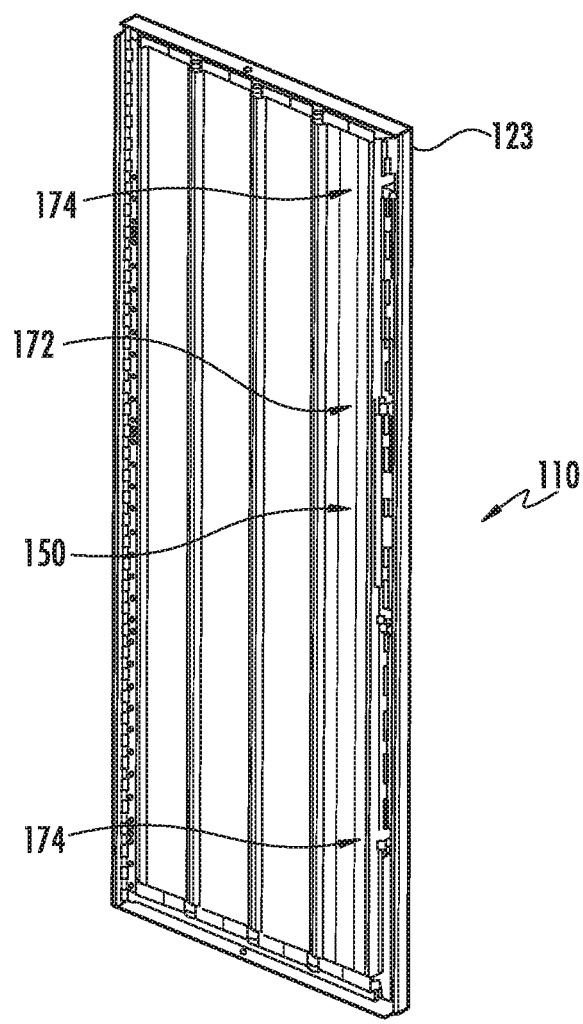
FIG. 16 is a rear view of the door of the cabinet of FIG. 1, with the locking assembly in its locked configuration.
Figure 19:
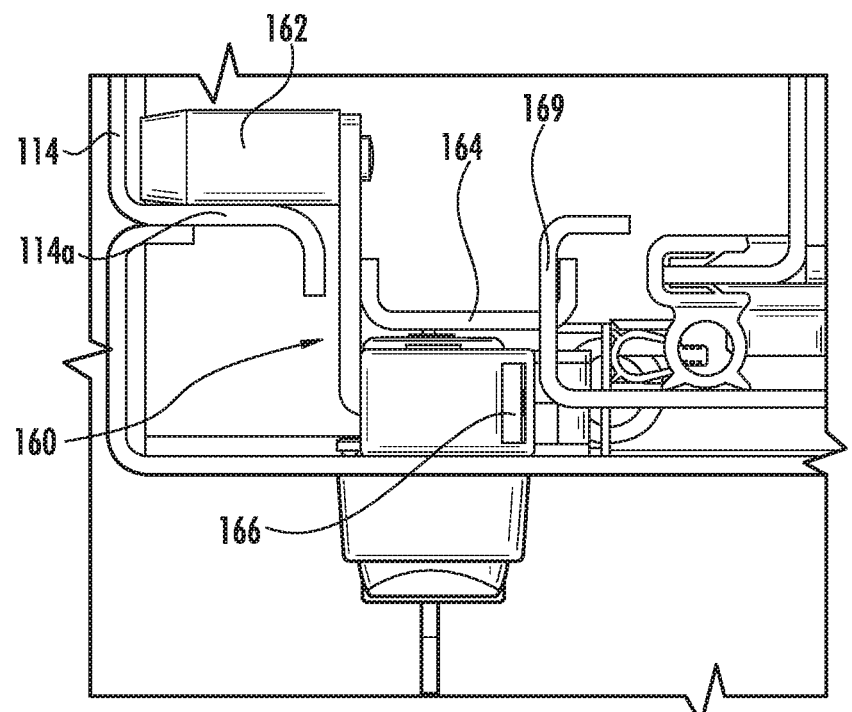
FIG. 19 is an enlarged partial top view of the door and locking assembly of the cabinet of FIG. 1, with the locking assembly in its locked configuration.

An additional subassembly 172 comprising a cam 156 with teeth 158 and a dual lock member 160 is mounted on the rear surface of the upright 123 (see FIGS. 16 and 17). Further, two more subassemblies 174 are mounted near the top and bottom of the upright 123. The subassemblies 174 have a cam 156 with teeth 158 and a main door catch 162, but they lack a folding panel catch. The common lock bar 166 includes holes 168 adjacent each of these additional subassemblies 172.

In operation, the cabinet 100 is typically closed and sealed to the environment (FIGS. 1, 5, 11 and 17-19). More specifically, the door assembly 110 is in a closed position, in which the frame 120 of the door assembly 110 engages the gasket 112 of the frame 108 to seal the internal cavity 105. The door panels 131-134 are in an unfolded condition, in which the door panels 131-134 are parallel with each other and substantially coplanar (see FIGS. 1, 5 and 10). The gaskets 142 provide sealing between the door panels 131-134 and between the door panel 131 and the upright 123. The lock assembly 150 secures the door assembly 110 in place. The main door catches 162 are positioned against the rear surface of the lateral flange 114a of the upright 114 to prevent pivoting of the door assembly 110 about the vertical axis A. The folding panel catches 164 are positioned to engage an angled member 169 attached to the door panel 131, which prevents sliding of the door panels 131-134. The teeth of the cams 156 are received in holes 168 in the common locking bar 166, thereby preventing movement thereof. Also, in the locked position the stay bar 119 is generally parallel with the slotted bar 109, with the pin 119b located away from the right end of the slot 109.

Figure 14:
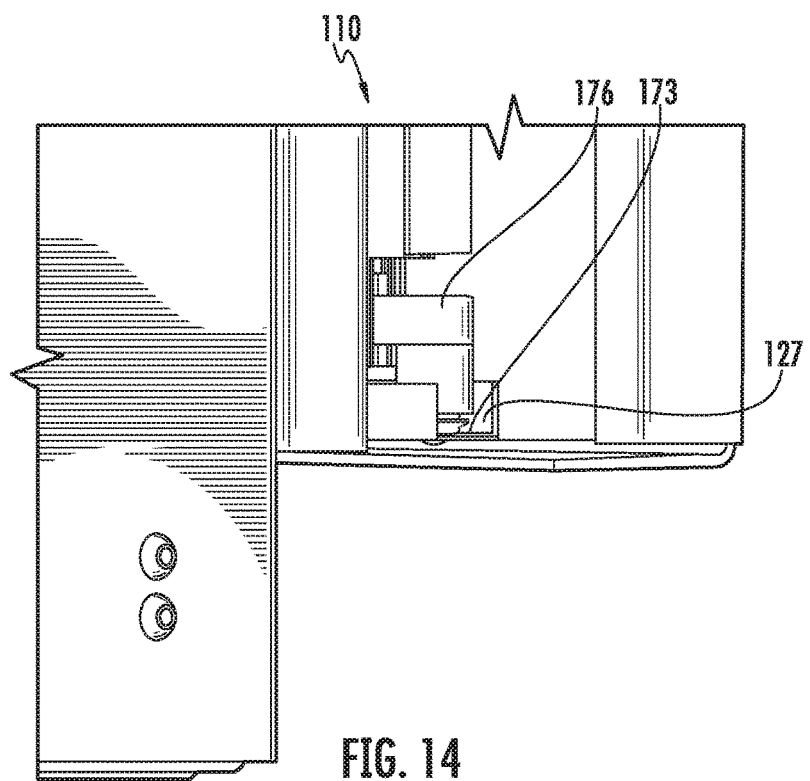
FIG. 14 is a rear partial perspective view of the spring-loaded plunger of the cabinet of FIG. 1.

Referring to FIG. 14, a spring-loaded plunger 176 is mounted to and extends below the lower edge of the door panel 131. In the closed position shown in FIGS. 1, 5, 10 and 17-19, the plunger 176 extends into a hole 173 in the lower cross-bar 121 of the frame 120. This interaction can help to maintain the door panels 131-134 in their unfolded position, even when, as described below, the door assembly 110 is unlocked.

Figure 12:
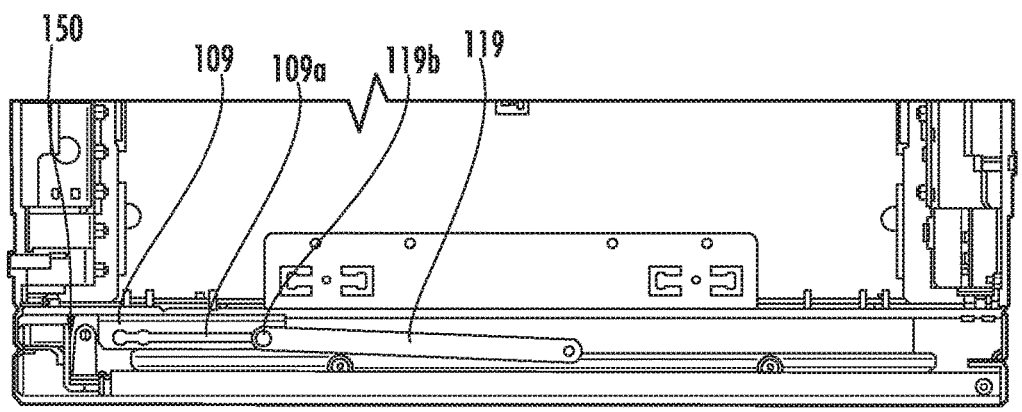
FIG. 12 is an enlarged partial top section view of the cabinet of FIG. 1 showing the door assembly in the closed position and the lock in the unlocked position.
Figure 13:
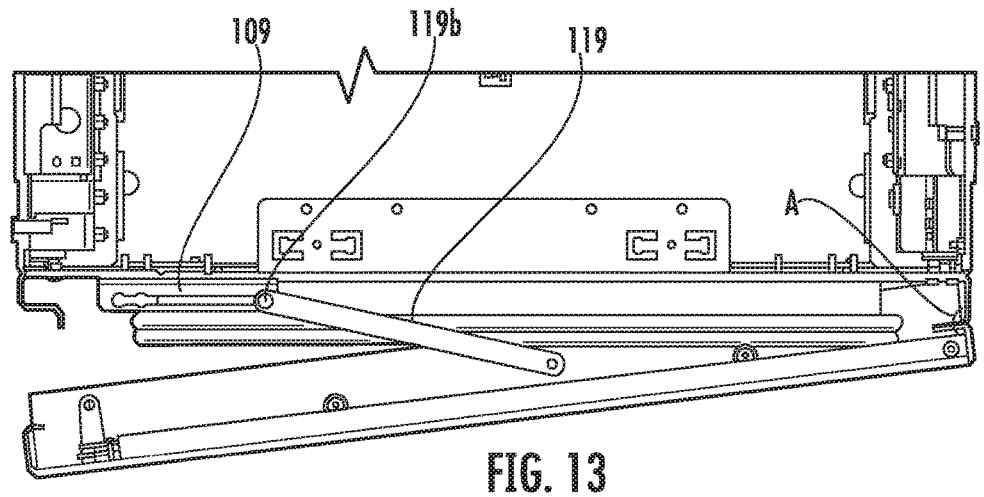
FIG. 13 is an enlarged partial top section view of the cabinet of FIG. 1 showing the door assembly in the open position.

The door assembly 110 can be slightly opened to an "ajar" position when the lock 150 is unlocked (shown in FIGS. 2, 12 and 13). When the padlock is removed from the handle 152, the handle 152 can be rotated a quarter-turn. Rotation of the handle 152 rotates the shaft 154 and the cam 156. The shaft rotation moves the main door catch 162 away from the upright 114 to a downwardly-extending position (see FIGS. 20 and 21). Also, rotation of the cam 156 drives the common locking bar 166 upwardly through the engagement of the teeth 158 with the holes 168 in the common locking bar 166. As the common locking bar 166 rises, it causes the subassembly 172 and the subassemblies 174 to rotate in a manner similar to the cam 156 and dual lock member 160 described above, which draws the remaining main door catches 162 and folding door catches 164 away from, respectively, the upright 114 and the angled member 169.

Figure 20:
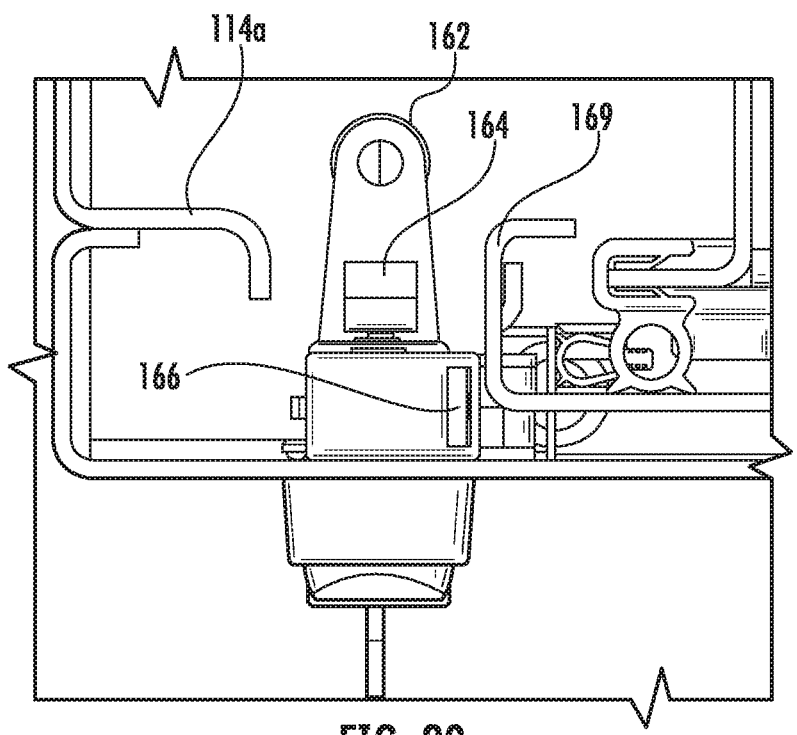
FIG. 20 is an enlarged partial top view of the door and locking assembly of the cabinet of FIG. 1 as in FIG. 19, with the locking assembly in its unlocked configuration.
Figure 21:
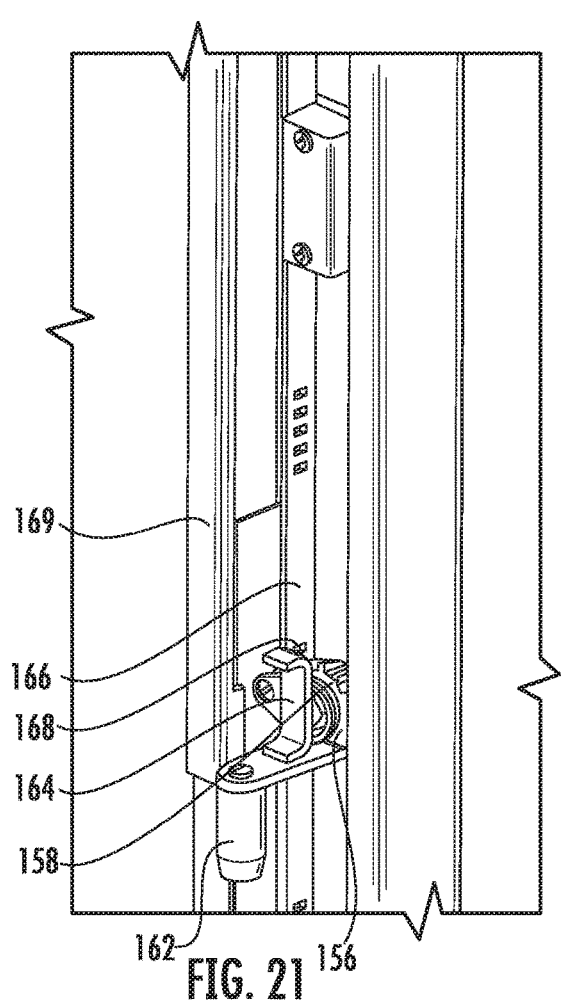
FIG. 21 is an enlarged partial rear view of the door and locking assembly of the cabinet of FIG. 1 as in FIG. 18, with the locking assembly in its locked configuration.
Figure 22:
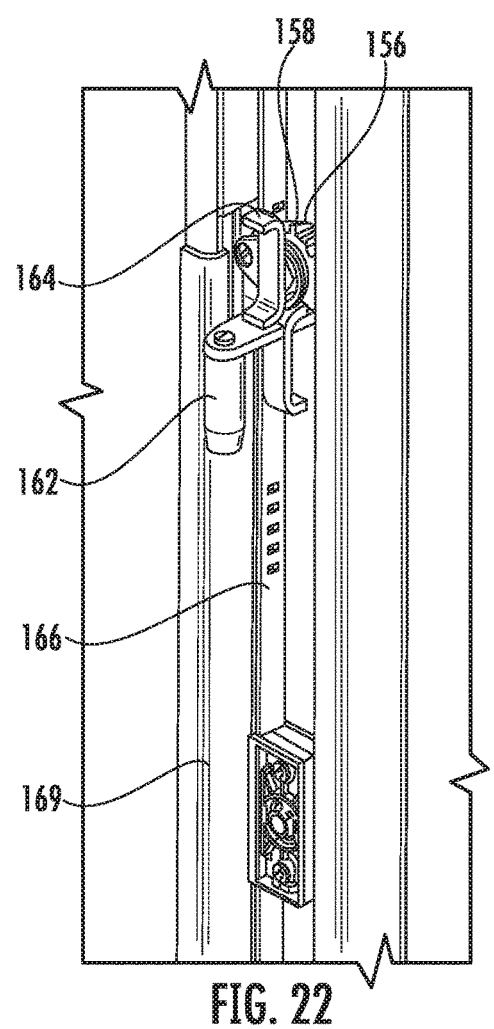
FIG. 22 is another enlarged partial rear view of the door and locking assembly of the cabinet of FIG. 1 as in FIG. 17, with a different locking assembly in its locked configuration.

Once the main door catches 162 have moved to the unlocked position shown in FIGS. 20-22, the door assembly 110 is free to open by pivoting about the vertical axis A. The door assembly 110 continues to pivot about the pivot 126 until the pin 119b of the stay bar 119 reaches the right end of the slot 109a in the slotted bar 109. At this point the door assembly 110 is prevented from opening further (see FIGS.

12 and 13). As can be seen in FIGS. 5 and 13, in moving from the closed position to the ajar position, the door assembly 110 may pivot about the vertical axis A over only a small angle (e.g., 3 to 15 degrees, and in some cases 3-10 degrees).

Once the door assembly 110 has stopped pivoting, the folding doors 131-134 can be moved from the unfolded position to the folded position. This movement may be facilitated through use of a grip 180 located on the front surface of the door panel 131. Application of force to the grip 180 can overcome the resistance provided by the plunger 176 in the hole 173. This allows the door panels 131-134 to pivot relative to each other and slide within the tracks 121, 122 (see FIGS. 4, 9 and 15), such that the door panels 131-134 take a folded arrangement (see FIGS. 5, 7 and 8) in which the door panels 131-134 are generally parallel but non-coplanar, with the pivots between (a) door panels 131 and 132 and (b) door panels 133 and 134 moving forwardly. When the door panels 131-134 are fully folded, the plunger 172 fits within a hole 175 in the lower track 121 (see FIG. 15) to maintain the door panels 131-134 in place. With the door panels 131-134 in this folded condition, the interior cavity 105 of the cabinet 100 is accessible to a technician.

Notably, when the door assembly 110 is open and the door panels 131-134 are folded, the site "footprint" occupied by the cabinet 100 and door assembly 110 is smaller than that of a cabinet of similar size with a conventional swinging door. For example, for a cabinet 100 having a width of 30-36 inches and a depth of 30-48 inches, the door assembly 110 extends the footprint of the cabinet forwardly only about 4-8 inches, and in some instances about 6-8 inches. In contrast, a conventional door hinged at a side edge thereof would extend in the open position about 30-36 inches. As a result, the leasing costs for a site using the cabinet 100 (which costs, as mentioned, would include the "door swing" area) can be reduced.

It is also notable that moving the door assembly 110 to the ajar position conveys the door panels 131-134 forwardly a sufficient distance that they are not in contact with the gasket 112 on the frame 108. As such, the door panels 131-134 can slide and fold without wearing or otherwise damaging the gasket 112, which could negatively impact the sealing capability of the gasket 112.

Those of skill in this art will appreciate that the cabinet 100 and components thereof may take different forms. As examples, FIGS. 23 and 24 show different profiles that may be employed with the door panels 131-134. Specifically, the door panels in FIG. 23 show profiles that are either of constant depth, have one recess in the front surface, or have one recess in each of the front and rear surfaces. FIG. 24 illustrates door panels with fins on the front side thereof that can provide a heat sink for the door panel. Other configurations are also possible.

In addition, FIG. 25 illustrates a gasket 144' for use between door panels having a different configuration. More specifically, each door panel would have two recesses that receive fingers 143' of the gasket 144'. Other configurations of door panels and gaskets may also be used.

The cabinet 100 may be particularly suitable for use as a module in a modular arrangement such as that described in U.S. Provisional Patent Application No. 62/544,040, filed Aug. 11, 2017, the disclosure of which is hereby incorporated herein in its entirety. Many electronics cabinets have cooling systems mounted to the inner surface of the door. The modular arrangement discussed in the aforementioned patent application utilizes a cooling system mounted to a side wall of one of the modules. Because the cooling system is not mounted on the door, the door is free to incorporate folding panels as described above to save on footprint area.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. An electronics cabinet, comprising;
   an enclosure comprising a floor, a ceiling, a rear wall, and opposed side walls configured to form an internal cavity;
   a door assembly attached to one of the side walls, the door assembly comprising:
   a main door pivotally connected to the enclosure, the main door including a window, the main door being movable between a closed position and an ajar position, wherein in the ajar position the main door is pivoted between about 3 and 15 degrees from the closed position; and
   a plurality of door panels, the door panels pivotally connected with each other, at least some of the door panels being pivotally and slidably attached to the main door, the door panels configured to move from an unfolded position, in which the door panels are generally coplanar and block access to the window, and a folded position, in which the door panels are generally parallel and non-coplanar and permit access to the window;
   wherein at least one of the door panels includes a recess in a front surface thereof.

2. The electronics cabinet defined in claim 1, wherein the main door and the door panels are configured such that the door panels are prevented from moving to the folded position when the main door is in the closed position.

3. The electronics cabinet defined in claim 1, further comprising a locking assembly on the main door, the locking assembly securing the main door in the closed position.

4. The electronics cabinet defined in claim 3, wherein the locking assembly prevents the door panels from moving to the folded position.

5. The electronics cabinet defined in claim 1, wherein a first endmost door panel is pivotally mounted to the main door but is not slidably mounted to the main door.

6. The electronics cabinet defined in claim 5, wherein a spring-loaded plunger is mounted to a second endmost door panel, the plunger maintaining the door panels in the unfolded position unless released.

7. The electronics cabinet defined in claim 1, wherein at least one door panel includes a gasket on a side edge thereof that engages a side edge of an adjacent door panel to form a seal therewith.

8. The electronics cabinet defined in claim 7, wherein the gasket resides within a recess in the side edge of the door panel.

9. The electronics cabinet defined in claim 1, wherein at least one of the door panels includes a plurality of fins on a front surface thereof that forms a heat sink.

10. The electronics cabinet defined in claim 1, wherein in the ajar position, the main door extends between about 4 and 8 inches forwardly of its position in the closed position.

11. An electronics cabinet, comprising:
an enclosure comprising a floor, a ceiling, a rear wall, and opposed side walls configured to form an internal cavity; and
a door assembly attached to one of the side walls, the door assembly comprising:
a main door pivotally connected to the enclosure, the main door including a window, the main door being movable between a closed position and an ajar position; and
a plurality of door panels, the door panels pivotally connected with each other, at least some of the door panels being pivotally and slidably attached to the main door, the door panels configured to move from an unfolded position, in which the door panels are generally coplanar and block access to the window, and a folded position, in which the door panels are generally parallel and non-coplanar;
wherein the main door and door panels are configured so that the door panels cannot move from the unfolded position to the folded position unless the main door is in the ajar position.

12. The electronics cabinet defined in claim 11, wherein in the ajar position, the main door extends between about 4 and 8 inches forwardly of its position in the closed position.

13. The electronics cabinet defined in claim 11, further comprising a locking assembly on the main door, the locking assembly securing the main door in the closed position.

14. The electronics cabinet defined in claim 13, wherein the locking assembly prevents the door panels from moving to the folded position.

15. The electronics cabinet defined in claim 11, wherein a first endmost door panel is pivotally mounted to the main door but is not slidably mounted to the main door.

16. The electronics cabinet defined in claim 15, wherein a spring-loaded plunger is mounted to a second endmost door panel, the plunger maintaining the door panels in the unfolded position unless released.

17. The electronics cabinet defined in claim 11, wherein at least one door panel includes a gasket on a side edge thereof that engages a side edge of an adjacent door panel to form a seal therewith.

18. The electronics cabinet defined in claim 17, wherein the gasket resides within a recess in the side edge of the door panel.

19. The electronics cabinet defined in claim 11, wherein at least one of the door panels includes a plurality of fins on a front surface thereof that forms a heat sink.

20. An electronics cabinet, comprising:
an enclosure comprising a floor, a ceiling, a rear wall, and opposed side walls configured to form an internal cavity;
a door assembly attached to one of the side walls, the door assembly comprising:
a main door pivotally connected to the enclosure, the main door including a window, the main door being movable between a closed position and an ajar position, wherein in the ajar position the main door is pivoted between about 3 and 15 degrees from the closed position;
a plurality of door panels, the door panels pivotally connected with each other, at least some of the door panels being pivotally and slidably attached to the main door, the door panels configured to move from an unfolded position, in which the door panels are generally coplanar and block access to the window, and a folded position, in which the door panels are generally parallel and non-coplanar and permit access to the window; and
a stay bar attached between the main door and the enclosure that limits the main door to opening only to the ajar position.

* * * * *